United States Patent
Pillai et al.

(10) Patent No.: US 10,916,561 B2
(45) Date of Patent: Feb. 9, 2021

(54) METHOD OF FABRICATING SEMICONDUCTOR DEVICE

(71) Applicant: Tokyo Electron Limited, Tokyo (JP)

(72) Inventors: Karthik Pillai, Albany, NY (US); Soo Doo Chae, Albany, NY (US); Sangcheol Han, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/374,450

(22) Filed: Apr. 3, 2019

(65) Prior Publication Data

US 2019/0304995 A1  Oct. 3, 2019

Related U.S. Application Data

(60) Provisional application No. 62/651,963, filed on Apr. 3, 2018.

(51) Int. Cl.

| | |
|---|---|
| *H01L 21/00* | (2006.01) |
| *H01L 27/00* | (2006.01) |
| *H01L 29/00* | (2006.01) |
| *H01L 27/11582* | (2017.01) |
| *H01L 27/1157* | (2017.01) |
| *H01L 21/02* | (2006.01) |

(Continued)

(52) U.S. Cl.
CPC .... *H01L 27/11582* (2013.01); *H01L 21/0217* (2013.01); *H01L 21/02178* (2013.01);
(Continued)

(58) Field of Classification Search
CPC ......... H01L 21/32051; H01L 21/31111; H01L 21/02178; H01L 21/02181; H01L 21/02532; H01L 21/02186; H01L 21/0217; H01L 21/32133; H01L 21/30604; H01L 21/02189; H01L 27/1157; H01L 27/11582; H01L 27/11556; H01L 29/40117; H01L 29/42392; H01L 29/66545; H01L 29/78696

See application file for complete search history.

(56) References Cited

U.S. PATENT DOCUMENTS 7,312,120 B2 * 12/2007 Shea ..................... H01L 21/306
438/255
9,012,974 B2 * 4/2015 Chae ................... H01L 29/7926
257/324

(Continued)

OTHER PUBLICATIONS

Korean Intellectual Property Office, International Search Report and Written Opinion for International Application No. PCT/US2019/025605, dated Jul. 18, 2019, 11pp.

*Primary Examiner* — Nikolay K Yushin

(57) ABSTRACT

A method is provided for forming a semiconductor device. The method includes forming a vertical film stack containing a sacrificial layer on a substrate and dielectric layers alternatingly and repeatedly stacked on the sacrificial layer, removing the sacrificial layer to form a horizontal channel above the substrate, depositing a conformal dielectric layer in the horizontal channel, etching trenches in the vertical film stack that connect to the horizontal channel. The method further includes removing the conformal dielectric layer from the horizontal channel, filling the horizontal channel and the trenches with a first electrically conductive material, removing the first electrically conductive material from the trenches, and filling the trenches with a second electrically conductive material.

13 Claims, 9 Drawing Sheets

(51) Int. Cl.
*H01L 21/306* (2006.01)
*H01L 21/3205* (2006.01)
*H01L 21/3213* (2006.01)
*H01L 21/311* (2006.01)
*H01L 21/28* (2006.01)

(52) U.S. Cl.
CPC .. *H01L 21/02181* (2013.01); *H01L 21/02186* (2013.01); *H01L 21/02189* (2013.01); *H01L 21/02532* (2013.01); *H01L 21/30604* (2013.01); *H01L 21/31111* (2013.01); *H01L 21/32051* (2013.01); *H01L 21/32133* (2013.01); *H01L 27/1157* (2013.01); *H01L 29/40117* (2019.08)

(56) References Cited

U.S. PATENT DOCUMENTS

| | | | |
|---|---|---|---|
| 9,209,031 B2* | 12/2015 | Baenninger | H01L 27/11582 |
| 2006/0043451 A1* | 3/2006 | Shea | H01L 21/31111 |
| | | | 257/309 |
| 2011/0291176 A1 | 12/2011 | Lee et al. | |
| 2012/0098139 A1* | 4/2012 | Chae | H01L 29/7926 |
| | | | 257/773 |
| 2013/0168745 A1 | 7/2013 | Joo | |
| 2015/0099338 A1 | 4/2015 | Yoo | |
| 2015/0255481 A1* | 9/2015 | Baenninger | H01L 27/11582 |
| | | | 438/268 |
| 2017/0103997 A1 | 4/2017 | Lee et al. | |

* cited by examiner

US 10,916,561 B2

METHOD OF FABRICATING SEMICONDUCTOR DEVICE

CROSS-REFERENCE TO RELATED APPLICATIONS

This application is related to and claims priority to U.S. Provisional Patent Application Ser. No. 62/651,963 filed on Apr. 3, 2018, the entire contents of which are herein incorporated by reference.

FIELD OF THE INVENTION

Embodiments of the invention relate to the field of semiconductors, and in particular, to three-dimensional semiconductor memory devices and a method of fabricating the same.

BACKGROUND OF THE INVENTION

In the case of typical two-dimensional (2D) or planar semiconductor devices, integration may be determined by the area occupied by a unit memory cell, which can be related to the level of fine patterning technology used to form those cells. The expense associated with the processing equipment used for fine patterning may, however, limit the integration for two-dimensional or planar semiconductor devices.

To overcome such a limitation, three-dimensional (3D) semiconductor devices, including three-dimensionally-arranged memory cells, have been proposed. There may be, however, significant manufacturing obstacles in achieving low-cost, mass-production of 3D semiconductor memory devices, particularly in the mass-fabrication of 3D devices that maintain or exceed the operational reliability of their 2D counterparts.

Vertical NAND (V-NAND), or 3D V-NAND, is the latest technology in the flash memory world. This is where planar NAND (single planes of NAND cells) are stacked vertically, giving the 'V' in V-NAND. Due to the change in vertical arrangement of cells these solid state drives (SSDs) have better capacities at lower production costs, half the power requirements, twice the speed and ten times the longevity of planar NAND. Currently, selective epitaxial growth (SEG) formation is used at the body contact level of a 3D V-NAND. However, the SEG process is expensive and also has thermal budget constraints. New processing schemes are needed for simple and low cost integration at the body contact level.

SUMMARY OF THE INVENTION

Embodiments of the invention describe a method is provided for forming a semiconductor device, for example a V-NAND. The method includes forming a vertical film stack containing a sacrificial layer on a substrate and dielectric layers alternatingly and repeatedly stacked on the sacrificial layer, removing the sacrificial layer to form a horizontal channel above the substrate, depositing a conformal dielectric layer in the horizontal channel, and etching trenches in the vertical film stack that connect to the horizontal channel. The method further includes removing the conformal dielectric layer from the horizontal channel, filling the horizontal channel and the trenches with a first electrically conductive material, removing the first electrically conductive material from the trenches, and filling the trenches with a second electrically conductive material.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Embodiments of the invention provide a new processing scheme for a low-resistivity body contact with high performance for flash memory and a method of fabricating the same. According to one embodiment, the new processing scheme may be applied to 96-layer 3D V-NAND stacks.

Figure 1A:
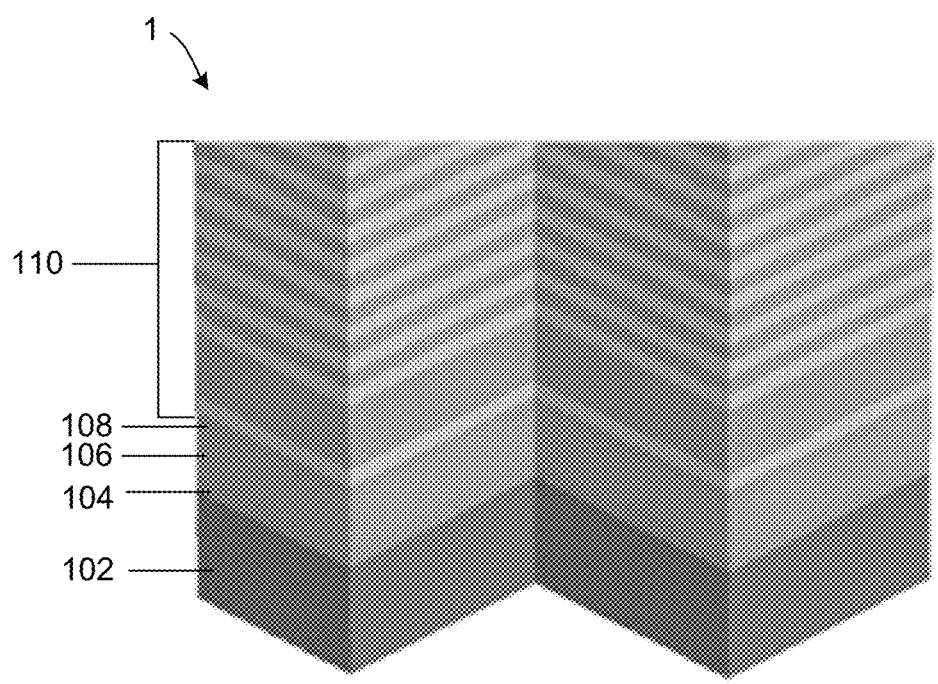
FIGS. 1A-1R illustrate portions of integrated circuit layers representing various operations in a method of fabricating a semiconductor device in accordance with an embodiment of the present invention.
Figure 1B:
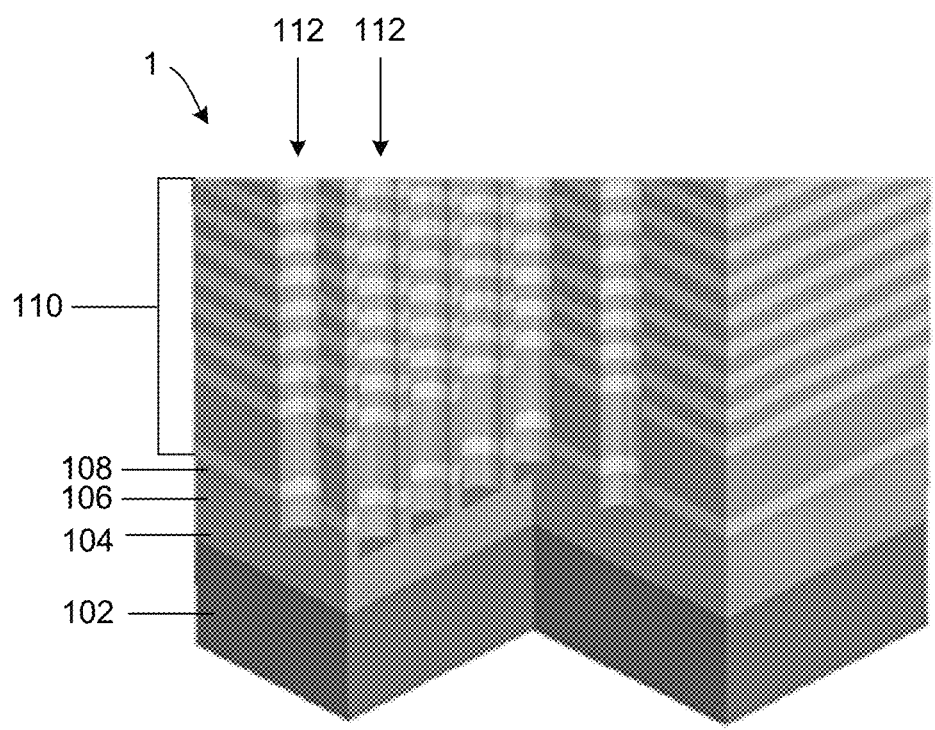
Figure 1C:
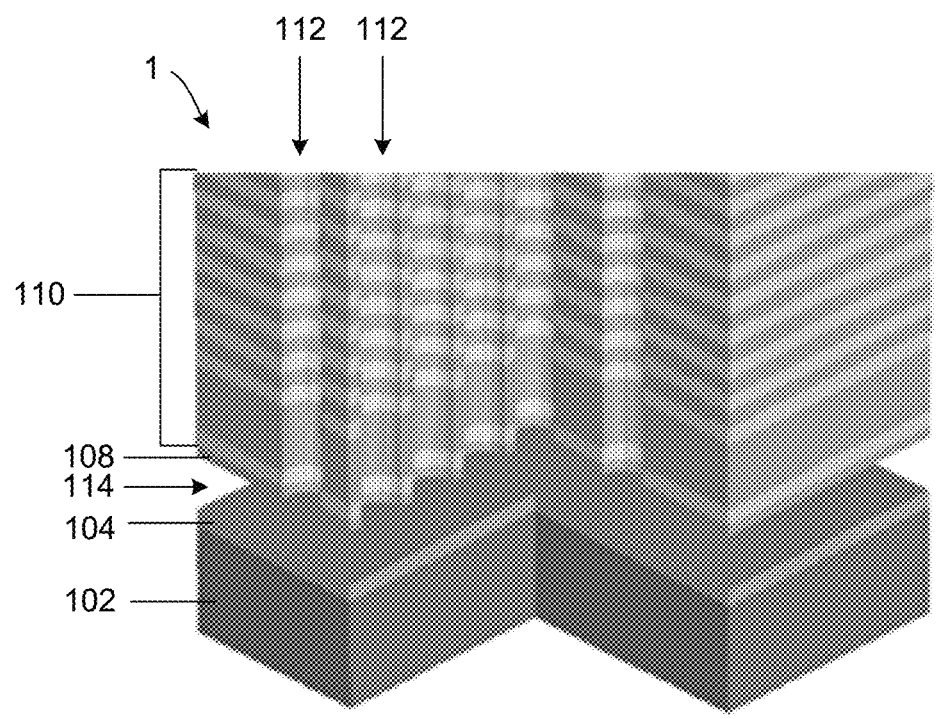
Figure 1D:
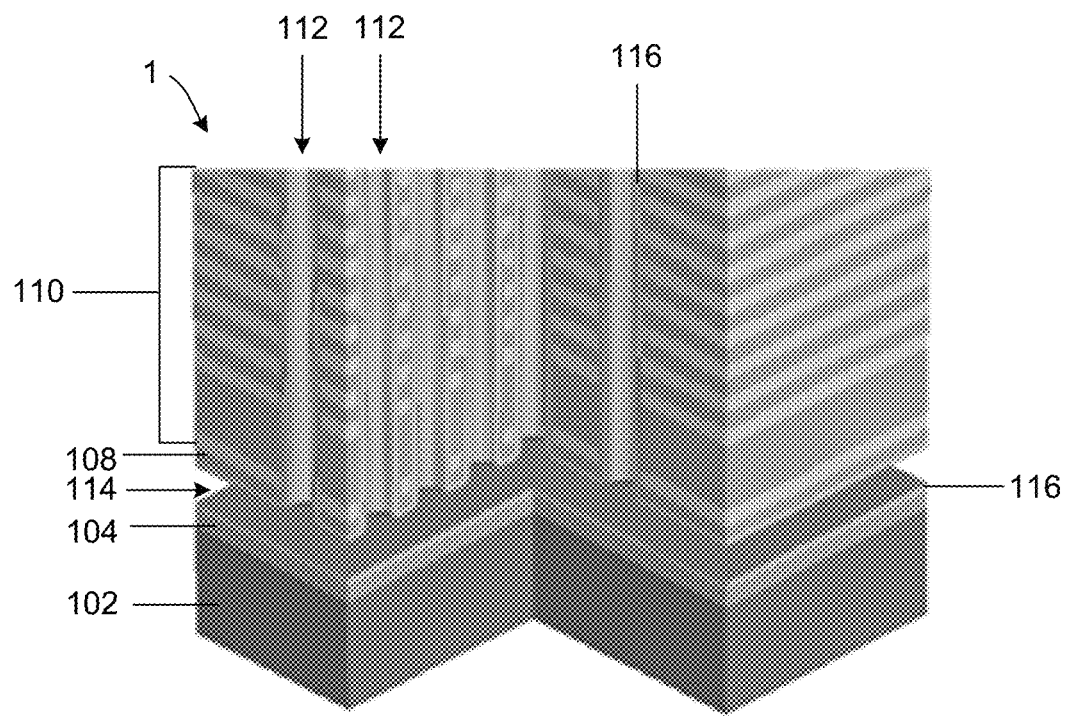
Figure 1E:
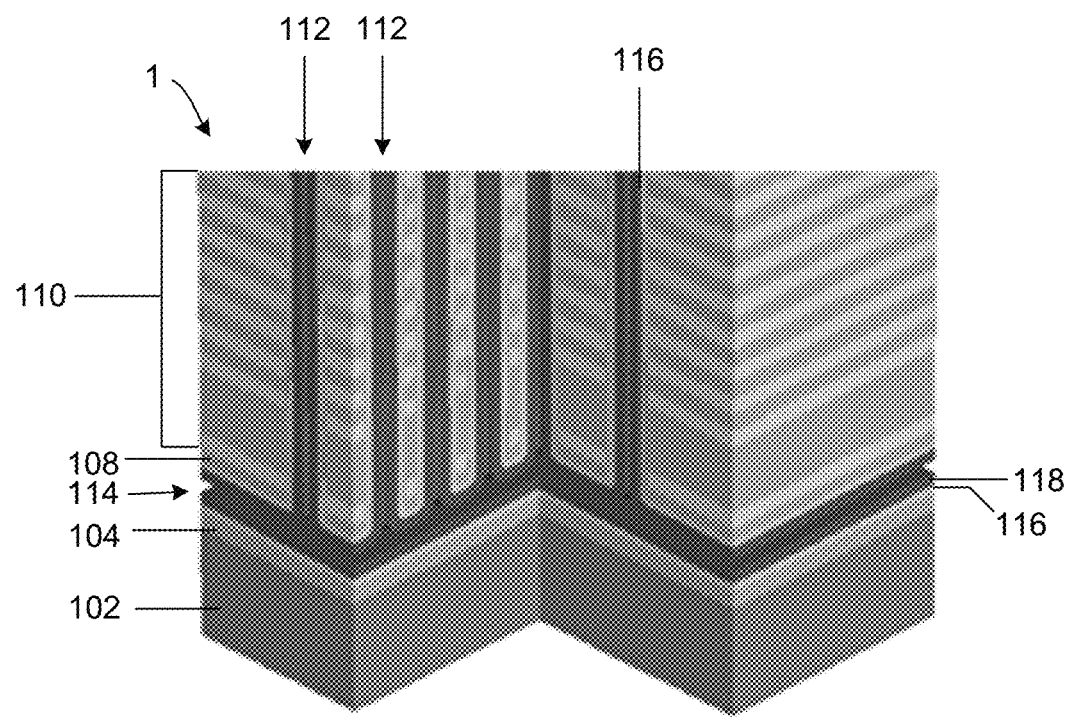
Figure 1F:
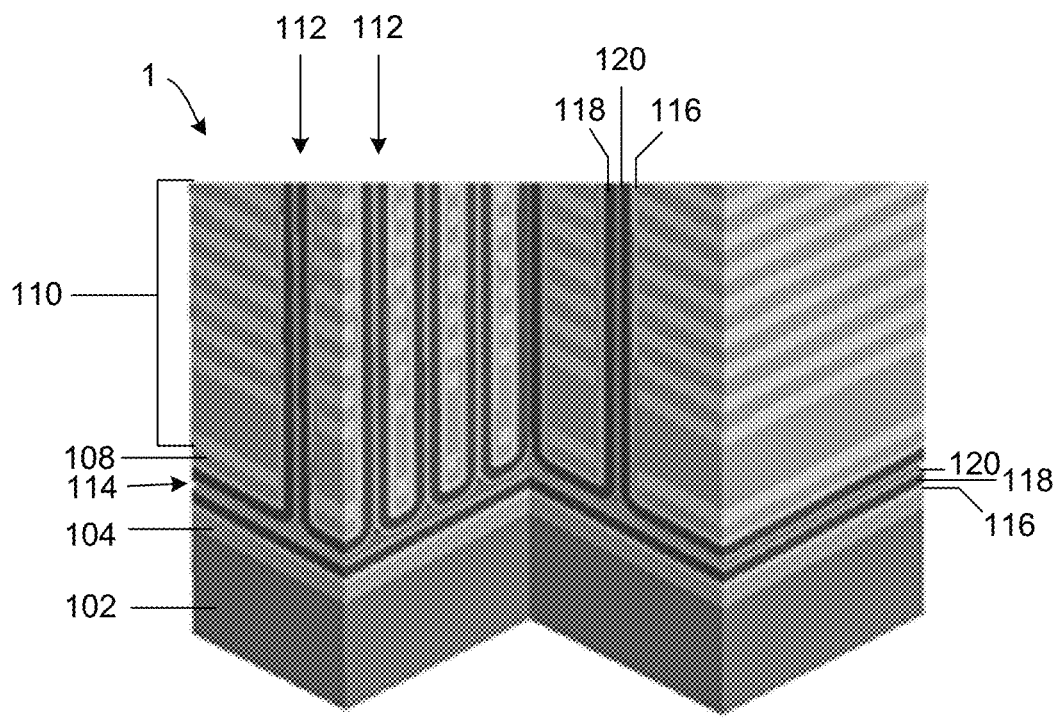
Figure 1G:
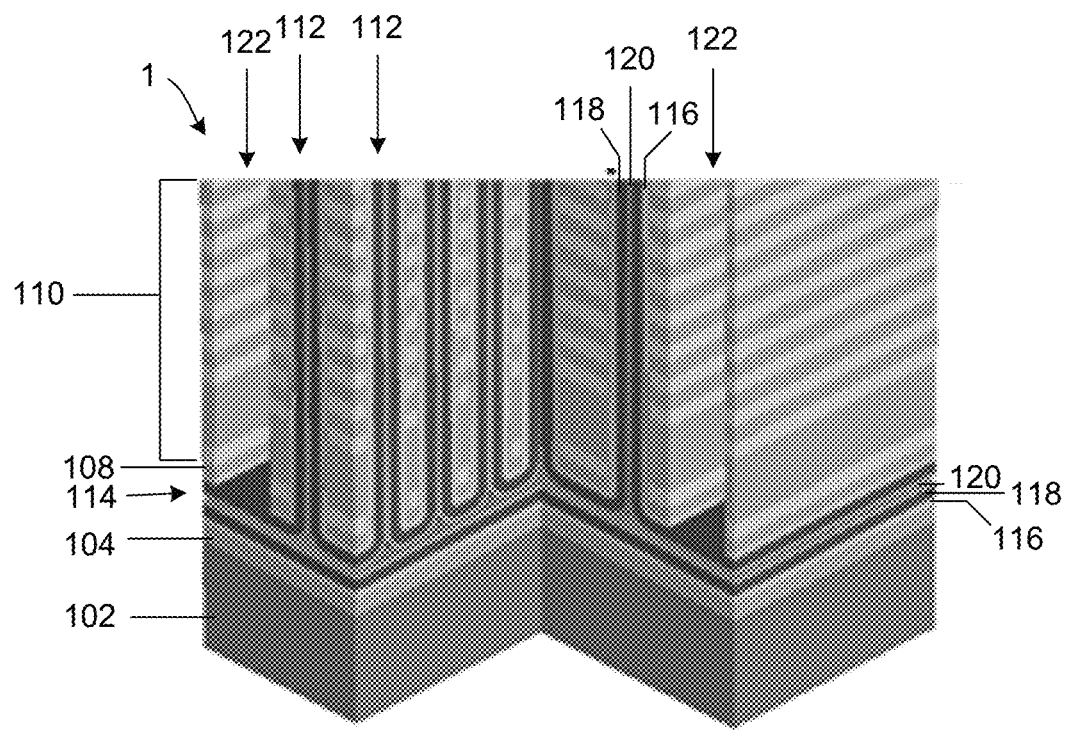
Figure 1H:
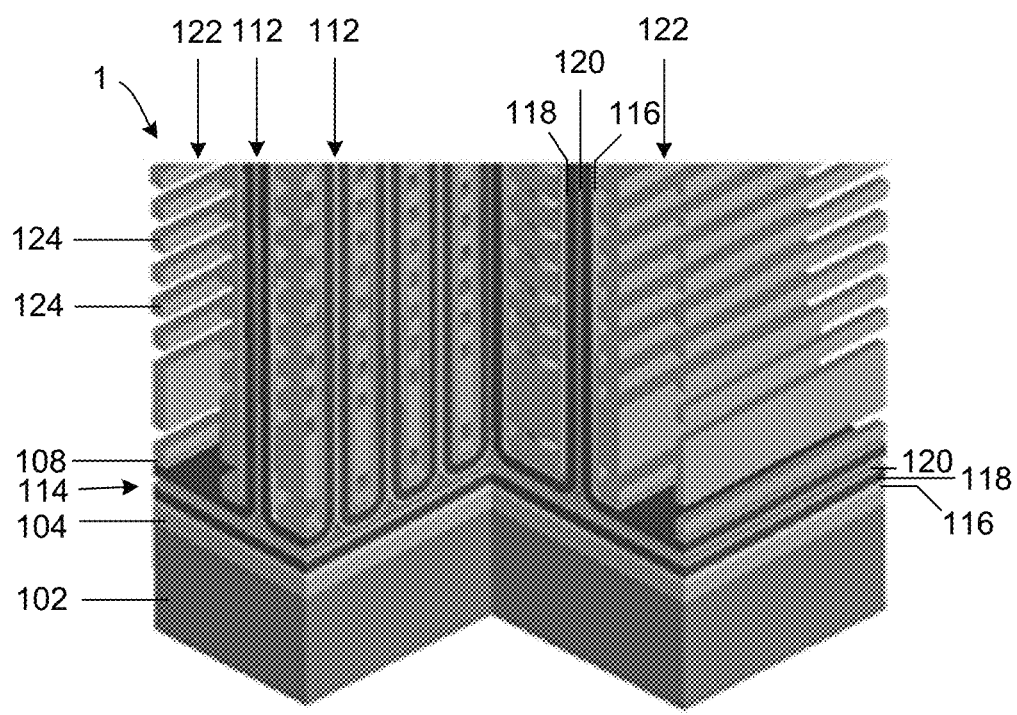
Figure 1I:
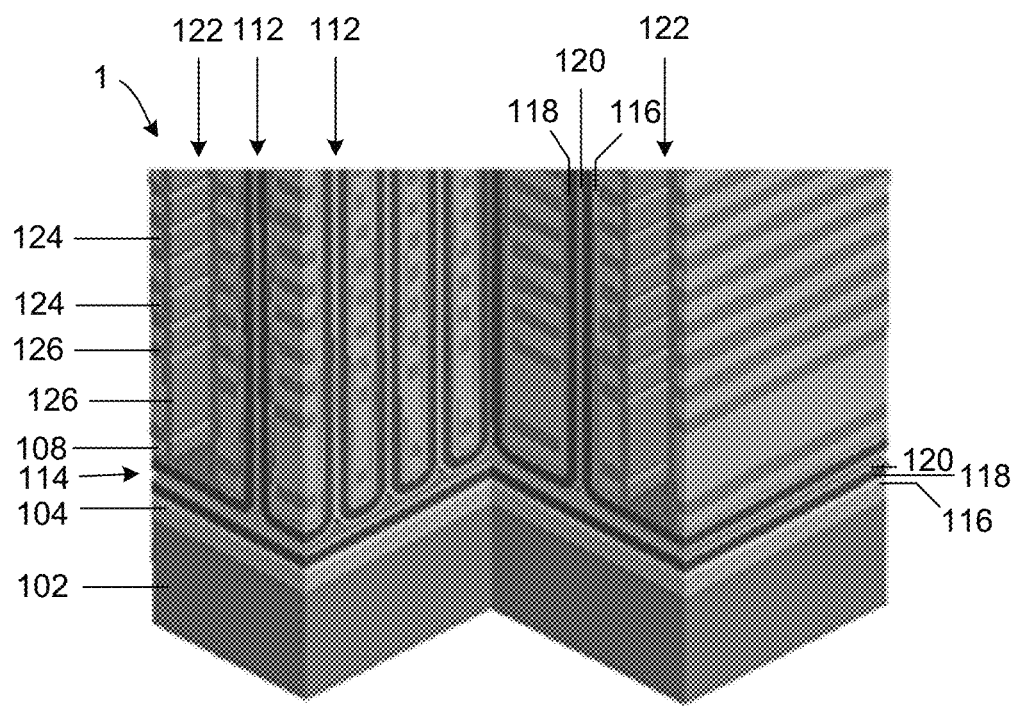
Figure 1J:
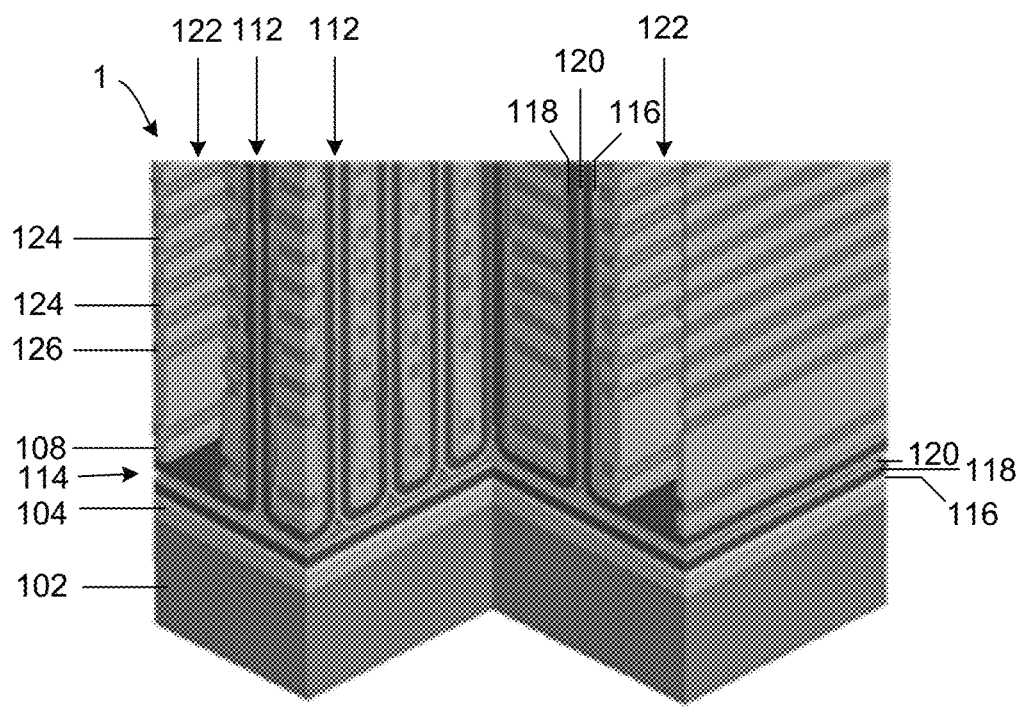
Figure 1K:
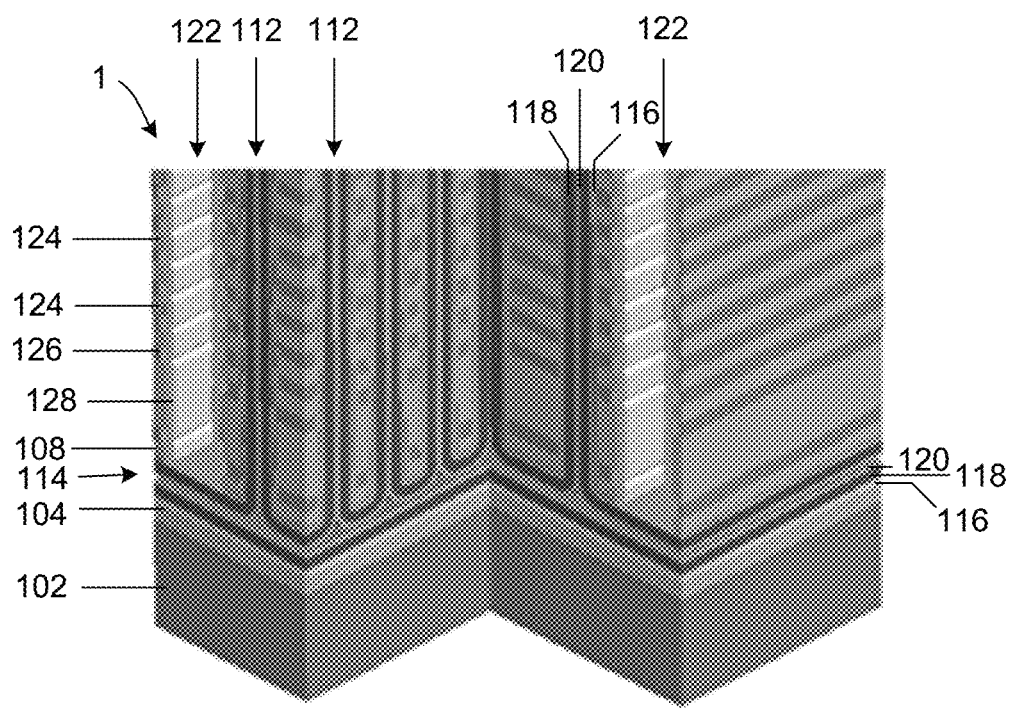
Figure 1L:
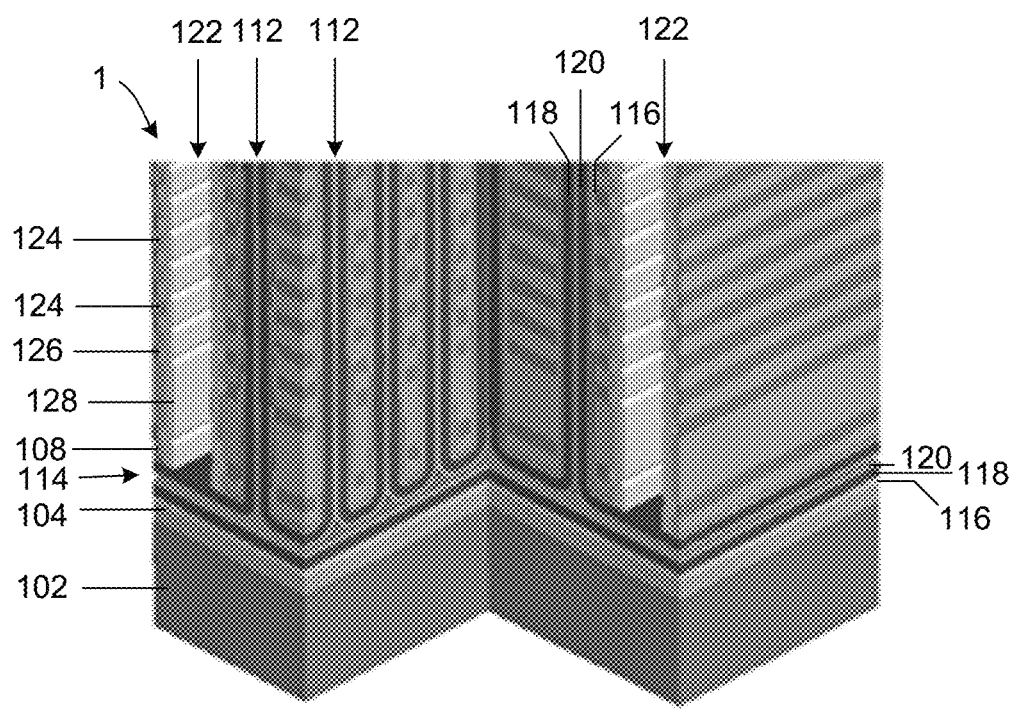
Figure 1M:
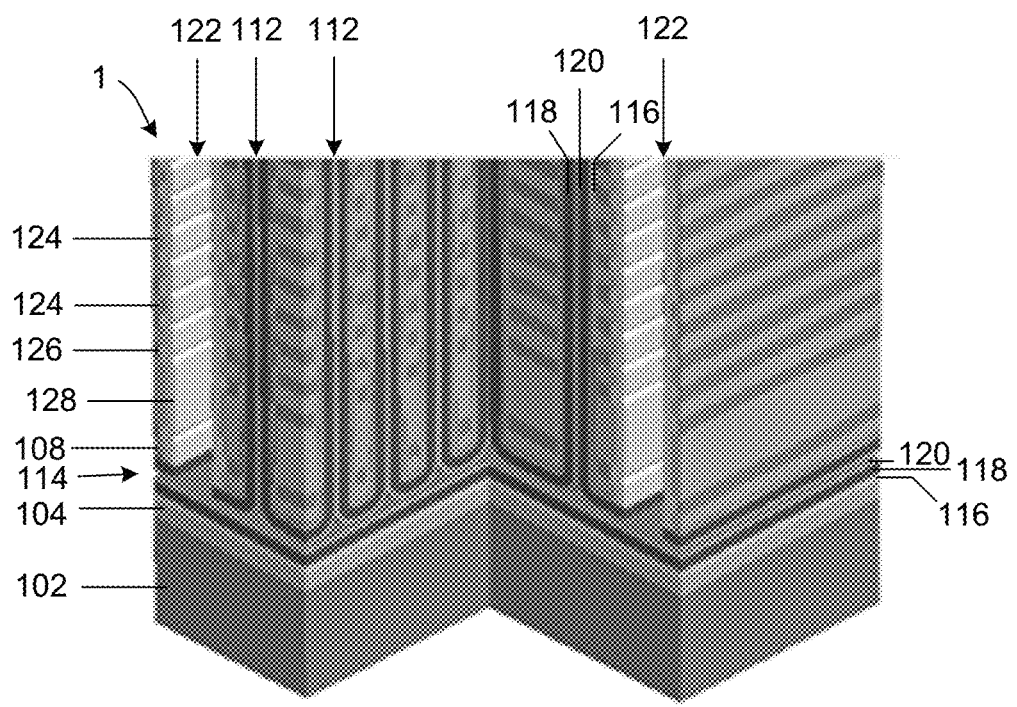
Figure 1N:
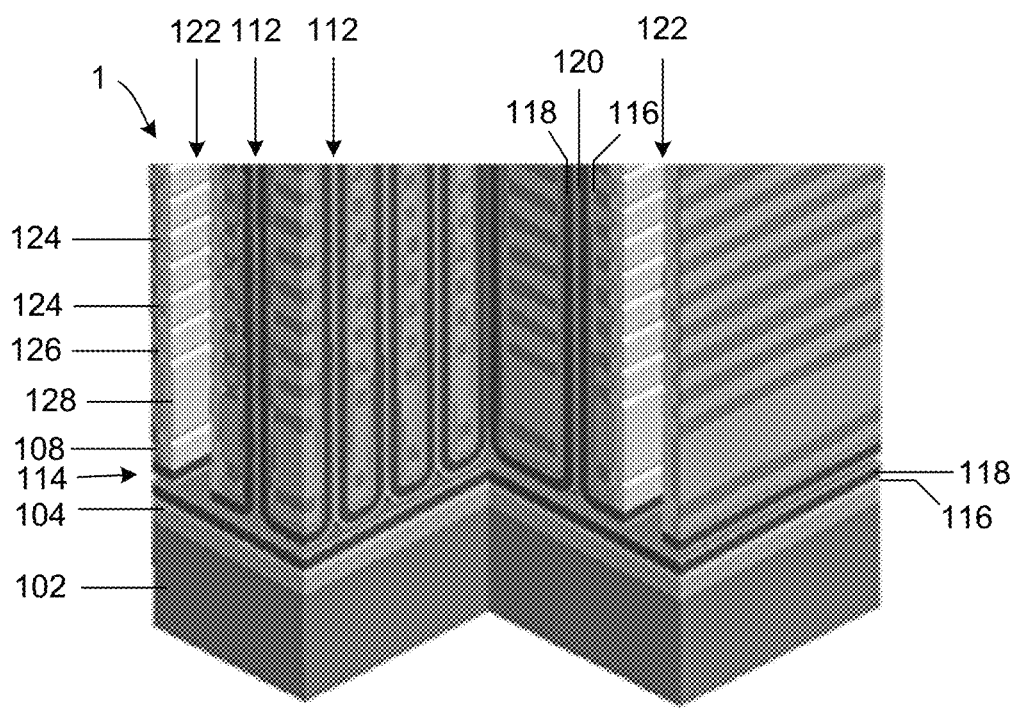
Figure 1O:
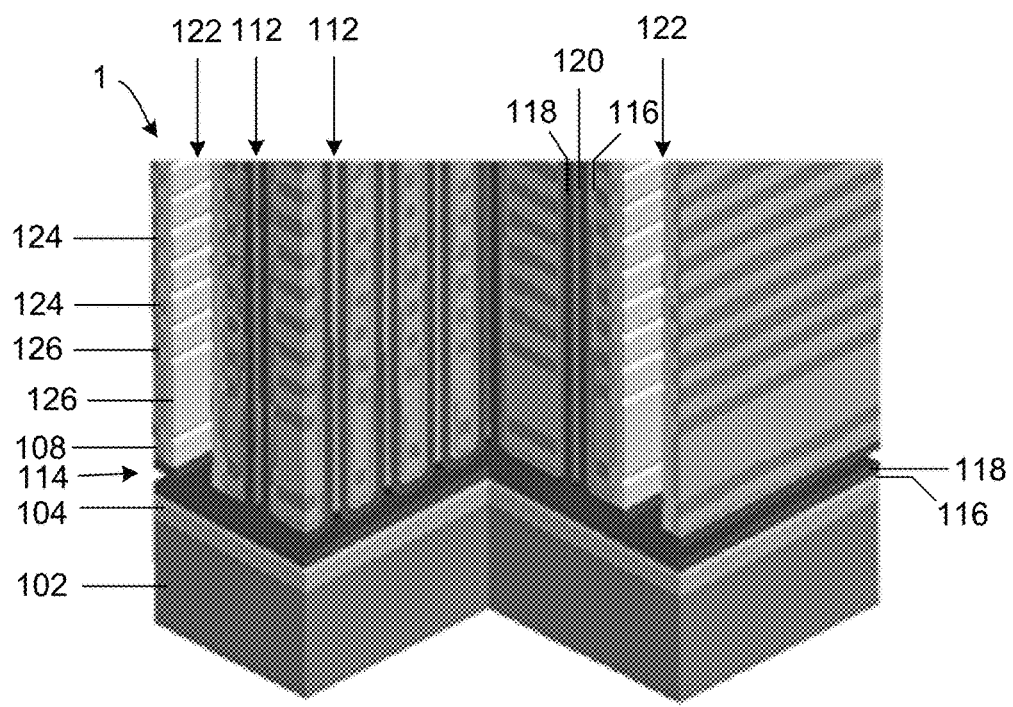
Figure 1P:
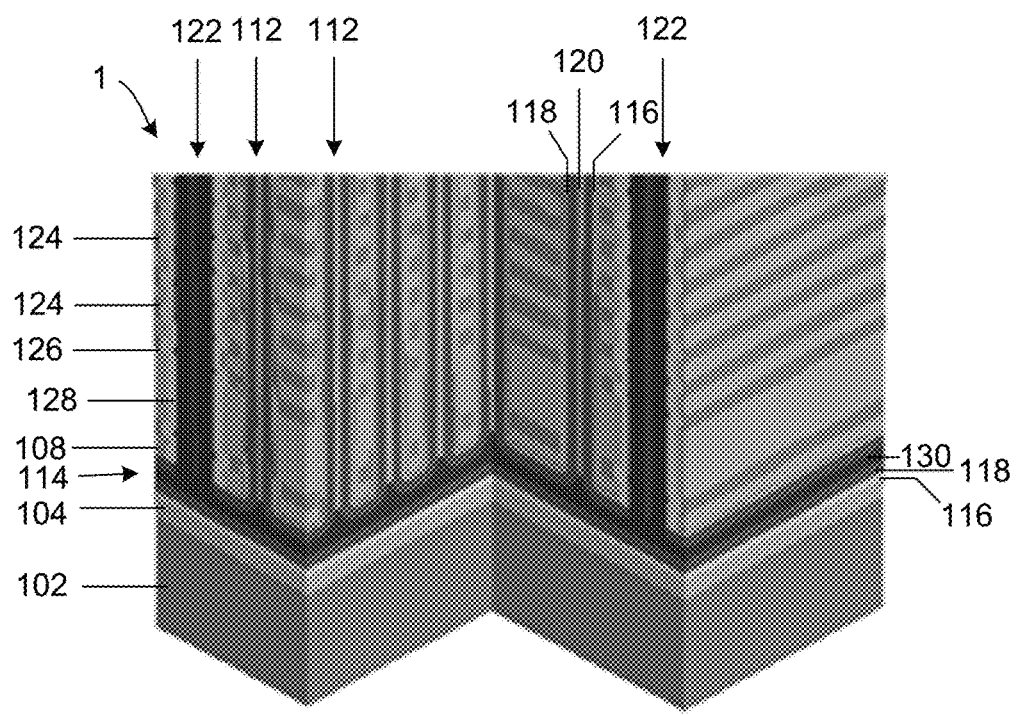
Figure 1Q:
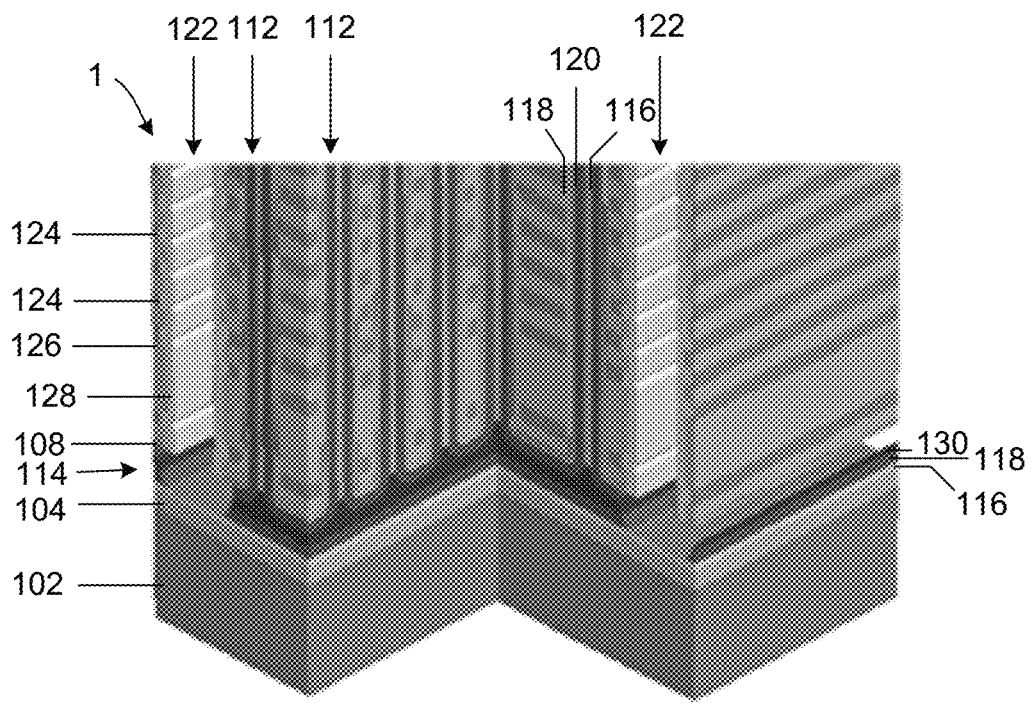
Figure 1R:
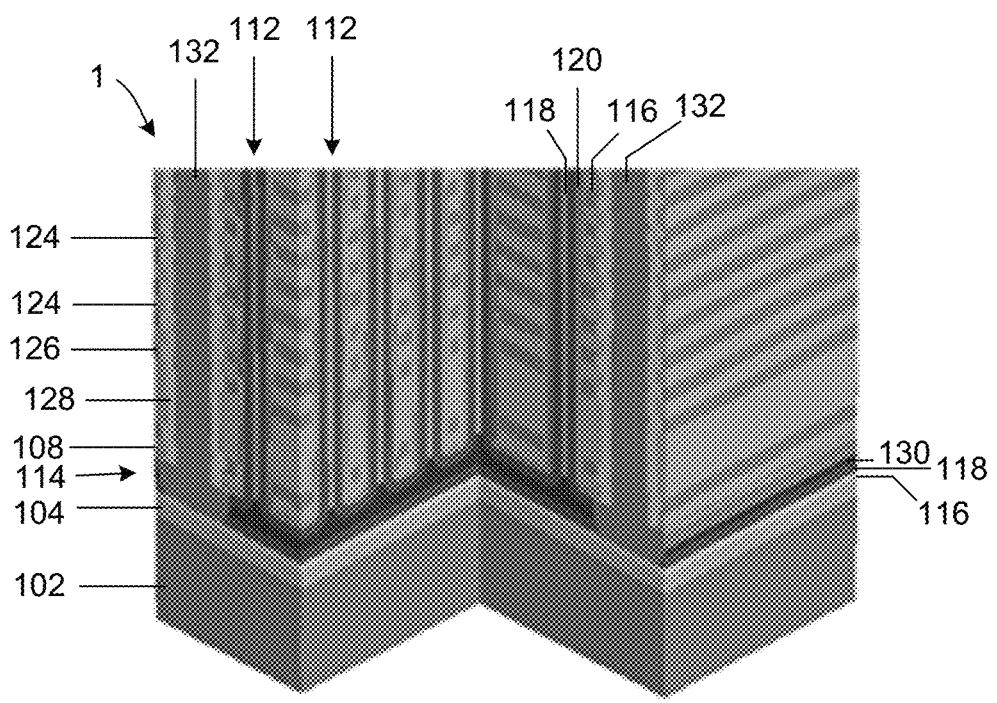

FIGS. 1A-1R illustrate portions of integrated circuit layers representing various operations in a method of fabricating a semiconductor device in accordance with an embodiment of the present invention. FIG. 1A shows a vertical film stack 1 containing a base layer 102 at the body contact level of a substrate, a first $SiO_2$ layer 104 on the base layer 102, a sacrificial layer 106 on the $SiO_2$ layer 104, a second $SiO_2$ layer 108 on the sacrificial layer 106, and a plurality of alternating SiN and $SiO_2$ layers 110 on the second $SiO_2$ layer 108. In the example shown in FIG. 1 A, the sacrificial layer 106 is bordered by the $SiO_2$ layer 104 from below and by the $SiO_2$ layer 108 from above. In one example, the vertical film stack 1 may be deposited as blanket layers on the base layer 102. According to other embodiments, the plurality of alternating SiN and $SiO_2$ layers 110 may be replace by other dielectric materials. According to embodiments of the invention, the sacrificial layer 106 may have a thickness of about 100 nm and may be deposited by spin-on techniques or by vapor phase deposition such as chemical vapor deposition (CVD) or atomic layer deposition (ALD). The sacrificial layer 106 may contain a metal oxide ($MeO_x$), for example, $AlO_x$ (e.g., $Al_2O_3$), $TiO_x$ (e.g., $TiO_2$), $ZrO_x$ (e.g., $ZrO_2$), or $HfO_x$ (e.g., $HfO_2$). In other examples, the sacrificial layer 106 may contain spin-on SiOC material or a spin-on glass (SOG). According to embodiments of the invention, the sacrificial layer 106 can easily be selectively removed relative to other materials of the vertical film stack 1, for example by conventional wet etching processes.

FIG. 1B illustrates the structure of FIG. 1A following etching of channel holes 112 through the vertical film stack 1 and into the sacrificial layer 106. The etching may be performed using well-known lithography and etching methods and the etching may be terminated before landing on the first $SiO_2$ layer 104.

FIG. 1C illustrates the structure of FIG. 1B following removal of the sacrificial layer 106, thereby forming a horizontal channel 114 in the vertical film stack 1 above the first $SiO_2$ layer 104. The removal may be performed using wet etching processes that provide high etch selectivity between the sacrificial layer 106 and other materials of the vertical film stack 1. According to embodiments of the invention, the horizontal channel 114 is created to enable formation of a horizontal conductive channel at the body contact level that is electrically connected to the vertical stack of the plurality of alternating dielectric layers 110.

FIG. 1D illustrates the structure of FIG. 1C following deposition of a conformal dielectric memory layer 116 in the channel holes 112 and in the horizontal channel 114 left by the removal of the sacrificial layer 106. In one example, the conformal dielectric memory layer 116 can include a SiO$_2$/SiN/SiO$_2$ laminate that is deposited by vapor phase deposition.

FIG. 1E illustrates the structure of FIG. 1D following deposition of a conformal Si layer 118 (e.g., poly-Si) on the conformal dielectric memory layer 116, where the conformal Si layer 118 partially fills the channel holes 112 and the horizontal channel 114.

FIG. 1F illustrates the structure of FIG. 1E following deposition of a conformal dielectric layer 120 (e.g., SiO$_2$) on the conformal Si layer 118, where the conformal dielectric layer 120 at least substantially fills the channel holes 112 and partially fills the horizontal channel 114.

FIG. 1G illustrates the structure of FIG. 1F following etching of trenches 122 through the vertical film stack 1, where the etching terminates on the conformal Si layer 118 above the horizontal channel 114. The etching may be performed using well-known lithography and etching methods.

FIG. 1H illustrates the structure of FIG. 1G following selective removal of the SiN layers from the plurality of alternating SiN and SiO$_2$ layers 110, thereby forming suspended SiO$_2$ layers 124. The selective removal may include conventional wet etching processes with high etch selectivity between SiO$_2$ and SiN materials.

FIG. 1I illustrates the structure of FIG. 1H following deposition of a conformal TiN/W laminate 126 in the trenches 122, including in the voids between the suspended SiO$_2$ layers 124.

FIG. 1J illustrates the structure of FIG. 1I following isotropic wet etching of the conformal TiN/W laminate 126 that removes the TiN/W laminate from the bottom and sidewalls of the trenches 122 and but leaves at least a portion of the TiN/W laminate 126 between the suspended SiO$_2$ layers 124.

FIG. 1K illustrates the structure of FIG. 1J following deposition of a conformal SiN layer 128 in the trenches 122, including on the sidewalls and on the bottom of the trenches 122.

FIG. 1L illustrates the structure of FIG. 1K following anisotropic etching of the conformal SiN layer 128 from the bottom of the trenches 122.

FIG. 1M illustrates the structure of FIG. 1L following anisotropic etching of the conformal Si layer 118 from the bottom of the trenches 122, and stopping on the conformal dielectric layer 120 in the horizontal channel 114.

FIG. 1N illustrates the structure of FIG. 1M following anisotropic etching of the conformal dielectric layer 120 at the bottom of the trenches 122. The anisotropic etching opens the horizontal channel 114 for subsequent removal of the conformal dielectric layer 120 from the horizontal channel 114.

FIG. 1O illustrates the structure of FIG. 1N following isotropic etching of the conformal dielectric layer 120 that removes the conformal dielectric layer 120 from the entire horizontal channel 114. In the case of a SiO$_2$ layer, a chemical oxide removal (COR) processes may be used for isotropic etching of the conformal dielectric layer 120.

FIG. 1P illustrates the structure of FIG. 1O following filling of the trenches 122 and the horizontal channel 114 with a first electrically conductive material 130. In one example, the first electrically conductive material 130 can include N$^+$-doped poly Si. In another example, the first electrically conductive material 130 can include phosphorus-doped SiO$_2$.

FIG. 1Q illustrates the structure of FIG. 1P following anisotropic etching of the first electrically conductive material 130 from the trenches 122 and the portion of the horizontal channel 114 under the trenches 122, where the first electrically conductive material 130 remains in other parts of the horizontal channel 114.

FIG. 1R illustrates the structure of FIG. 1Q following filling of the trenches 122 and the portion of the horizontal channel 114 under the trenches 122 with a second electrically conductive material 132. In one example, the second electrically conductive material 132 can include a TiN/W laminate.

A method is provided for forming a semiconductor device has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, the method comprising:
    forming a vertical film stack containing a sacrificial layer on a substrate and dielectric layers alternatingly and repeatedly stacked on the sacrificial layer;
    removing the sacrificial layer to form a horizontal channel above the substrate;
    depositing a conformal dielectric layer in the horizontal channel;
    etching trenches in the vertical film stack that connect to the horizontal channel;
    selectively removing one type of the dielectric layers that are alternatingly and repeatedly stacked on the sacrificial layer, thereby forming suspended dielectric layers;
    depositing a conformal TiN/W laminate in the trenches and voids between the suspended dielectric layers;
    anisotropically etching the conformal TiN/W laminate that removes the TiN/W laminate from the bottom and sidewalls of the trenches and forms TiN/W laminate layers between the suspended dielectric layers;
    removing the conformal dielectric layer from the horizontal channel;
    filling the horizontal channel and the trenches with a first electrically conductive material;
    removing the first electrically conductive material from the trenches; and
    filling the trenches with a second electrically conductive material.

2. The method of claim 1, wherein removing the conformal dielectric layer from the horizontal channel comprises:
    anisotropically etching the conformal dielectric layer at the bottom of the trenches; and
    isotropically etching the conformal dielectric layer from the entire horizontal channel.

3. The method of claim 1, wherein the sacrificial layer contains a metal oxide that includes Al$_2$O$_3$, TiO$_2$, ZrO$_2$, or HfO$_2$.

4. The method of claim 1, wherein the dielectric layers alternatingly and repeatedly stacked on the sacrificial layer include SiN and $SiO_2$.

5. The method of claim 1, wherein depositing the conformal dielectric layer in the horizontal channel includes depositing $SiO_2$.

6. The method of claim 1, wherein the first electrically conductive material contains $N^+$-doped poly Si or phosphorus-doped $SiO_2$.

7. The method of claim 1, wherein the second electrically conductive material contains a TiN/W laminate.

8. The method of claim 1, further comprising:
depositing a conformal SiN layer in the trenches; and
anisotropically etching the conformal SiN layer from the bottom of the trenches.

9. The method of claim 8, further comprising:
anisotropically etching the conformal SiN layer from the bottom of the trenches, and stopping on the conformal dielectric layer in the horizontal channel.

10. The method of claim 1, further comprising:
etching channel holes through the vertical film stack and into the sacrificial layer.

11. The method of claim 10, wherein the conformal dielectric layer at least substantially fills the channel holes and partially fills the horizontal channel.

12. The method of claim 10, further comprising:
depositing a conformal dielectric memory layer in the channel holes and in the horizontal channel.

13. The method of claim 12, further comprising:
depositing a conformal Si layer on the conformal dielectric memory layer, where the conformal Si layer partially fills the channel holes and the horizontal channel.

* * * * *